(12) United States Patent
Gong et al.

(10) Patent No.: US 7,714,663 B2
(45) Date of Patent: May 11, 2010

(54) CASCODE LOW NOISE AMPLIFIER WITH A SOURCE COUPLED ACTIVE INDUCTOR

(75) Inventors: Jeng Gong, Hsinchu (TW); I-Lun Huang, Taipei (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 11/976,339

(22) Filed: Oct. 24, 2007

(65) Prior Publication Data

US 2008/0111632 A1 May 15, 2008

(30) Foreign Application Priority Data

Oct. 27, 2006 (TW) .............................. 95139780 A

(51) Int. Cl.
*H03F 3/68* (2006.01)
(52) U.S. Cl. ...................................................... 330/310
(58) Field of Classification Search ......... 330/310–311, 330/283, 305
See application file for complete search history.

(56) References Cited

U.S. PATENT DOCUMENTS

| | | | | |
|---|---|---|---|---|
| 6,147,559 A | * | 11/2000 | Fong | 330/311 |
| 6,731,175 B1 | * | 5/2004 | Chen | 330/311 |
| 7,042,317 B2 | * | 5/2006 | Xiao et al. | 333/214 |
| 7,323,939 B2 | * | 1/2008 | Han et al. | 330/311 |
| 7,389,091 B2 | * | 6/2008 | Tanaka | 455/126 |

* cited by examiner

*Primary Examiner*—Robert Pascal
*Assistant Examiner*—Hieu P Nguyen
(74) *Attorney, Agent, or Firm*—Rosenberg, Klein & Lee

(57) ABSTRACT

A cascode low noise amplifier includes an input transistor and an output transistor cascode together, the input transistor has a source coupled to an active inductor, and the output transistor has a drain to provide an output signal. By using the active inductor, the low noise amplifier has smaller size, lower noise figure, and higher gain. The active inductor also provides input impedance matching for the low noise amplifier.

14 Claims, 9 Drawing Sheets

CASCODE LOW NOISE AMPLIFIER WITH A SOURCE COUPLED ACTIVE INDUCTOR

FIELD OF THE INVENTION

The present invention is related generally to a low noise amplifier (LNA) and, more particularly, to a cascode low noise amplifier employing active inductor.

BACKGROUND OF THE INVENTION

In recent years, applications of wireless communications become popular quickly. For example, cell phones, wireless networks, and satellite phones have been widely used by people in their lives. Therefore, the needs of communications significantly increase, and the competition in international markets is intense. To provide a technology standard for the manufacturers to design their products, the Institute of Electrical and Electronics Engineers (IEEE) issues the IEEE 802.11 specification in 1997, which defines the physical layer (PHY layer) and media access control layer (MAC layer), and also defines the radio frequency (RF) band of 2.4 GHz, in which the data transfer rate is up to 2 Mbps. Then, the 802.11a specification focuses on industry, science and medicine (ISM) band of 5 GHz (5.15-5.35 GHz, 5.725-5.8252 GHz), in which the data transfer rate reaches 20-54 Mbps, and the 802.11b specification continues the existed 2.4 GHz physical layer.

In the development of the main chip in communication devices, there are several important factors, such as to reduce size and cost, to limit power consumption, and to improve chip performance. In the past, the transmission frequency is restricted by the low electron drift mobility of silicon elements, so the RF front-end circuits are usually implemented by GaAs transistors. In resent years, however, many new processes are developed so that the size of complementary metal-oxide-semiconductor (CMOS) elements is dramatically reduced, and the operating frequency of CMOS circuits is thereby increased. Now, CMOS processes have had the advantages of low power, high integration, and low cost, and so take an important role in the competition between integrated circuit (IC) design houses.

FIG. 1 is a block diagram of a RF receiver system 100, in which the RF signal received by an antenna 102 is amplified by a low noise amplifier 104, and mixed with an oscillating signal from a local oscillator 110 by two quadrature mixers 106 and 108, so as to be demodulated to be two signals with a desired band. The demodulated signals are further amplified by two amplifiers 112 and 114, filtered by two filters 116 and 118, and converted into two analog signals by two analog-to-digital converters (ADCs) 120 and 122 respectively. In this system 100, the low noise amplifier 104 is the dominant stage regarding the noise performance of the whole system 100. In consideration of noise figure and linearity, the low noise amplifier 104 is the most critical element of the RF receiver system 100.

Low noise amplifiers have two types, common gate configuration and cascode configuration. FIG. 2 shows a conventional cascode low noise amplifier 200, which comprises a pair of cascode transistors 202 and 204. The output transistor 202 has a drain D coupled with a load inductor L1, and a gate coupled with a bias voltage Vb. The input transistor 204 has a gate coupled with an input inductor L2, and a source S coupled with a degeneration inductor L3. The input signal of the cascode low noise amplifier 200 is Vin, and the output signal Vout is derived from the drain D of the transistor 202. For integrating all the elements of the low noise amplifier 200 into a single chip, on-chip spiral inductor is employed for the inductors L1, L2 and L3. However, the on-chip spiral inductor requires greater chip area, and its quality factor Q is restricted, so being unrealistic in applications. Further, the process of manufacturing the on-chip spiral inductor is complicated, requires higher cost, and is difficult to control the inductance of the on-chip spiral inductor. There also have been proposed to use micro electro-mechanical system (MEMS) process and other materials to improve the on-chip spiral inductor, but the effect on reducing the chip area is not significant, and the cost still cannot be reduced because the number of photomasks is increased and the elements become fragile. For cost saving, it is necessary for circuit design which requires less chip area.

An active inductor is a circuit composed of active elements for behaving as an inductor. For example, U.S. Pat. No. 6,784,749 to Cove et al uses an active inductor in the output of a limiting amplifier to improve the bandwidth and to reduce the size of the circuit. One advantage of an active inductor is that its size can be smaller than a passive inductor, so it can be used to replace an on-chip spiral inductor to reduce the circuit size. Another advantage of an active inductor is that it is adjustable, so the programmability can be expected, for example, if an active inductor is used in a low noise amplifier, the center frequency of the amplifier may be able to be programmed. However, there are still some disadvantages when using active inductor, and the worst case is that it brings greater noise, so it can be only used in low-frequency circuits, but not appropriate to high-frequency circuits. U.S. Pat. No. 6,028,496 to Ko et al. discloses a RF active inductor having high Q value, which is implemented by Si or GaAs field effect transistor (FET), and U.S. Pat. No. 7,068,130 to Redoute et al. further improves this RF active inductor to be without any independent DC voltage source to provide bias voltage.

The RF communication system market continues growing, which makes people have great interest in implementing RF elements by CMOS technology. To apply a CMOS active inductor to a RF circuit is a conception with high potential for development. A RF circuit using active inductor can reduce the chip size, and has both advantages of low cost and good circuit adaptation; for example, it can control the gain by using a current source, and improve the chip performance by adapting to the operating temperature. More importantly, a RF circuit using active inductor can control the inductance to obtain expected performance, and even can obtain high Q value easily. In Carreto-Castro et al., "RF Low-Noise Amplifiers in BiCMOS Technologies", IEEE Trans. on Circuits and Systems, pp. 974-977, vol. 46, Issue: 7, Jul. 1999, BiCMOS is proposed to implement a RF low noise amplifier using active inductor, and is expected to reduce the noise figure (NF). However, the effect is not significant according to their experiment data. This amplifier can be only used at 1 GHz, and its NF can only reach 3.4 dB. Furthermore, the cost of BiCMOS process is very high, it is doubtful that using BiCMOS active inductor could save cost, and the performance could be good enough. In Zhuo et al., "Programmable Low Noise Amplifier with Active-Inductor Load", Proceedings of the 1998 IEEE International Symposium on Circuits and Systems, vol. 4, pp. 365-368, 1998, a common gate CMOS low noise amplifier is proposed, which uses an active inductor to replace the original on-chip spiral inductor load, and so has a good adjustable range for 1 GHz center frequency. However, replacing the load inductor which is coupled to the output of the low noise amplifier by an active inductor causes greater noise, so it also can be only used in low frequency circuits.

SUMMARY OF THE INVENTION

One object of the present invention is to provide a cascode low noise amplifier employing active inductor.

Another object of the present invention is to reduce the chip size of a low noise amplifier.

Yet another object of the present invention is to decrease the NF of a RF low noise amplifier.

Still another object of the present invention is to increase the high frequency gain of a low noise amplifier with active inductors.

According to the present invention, a low noise amplifier comprises a pair of cascode transistors, among which is an input transistor having a source coupled with an active inductor. The low noise amplifier can be equivalent to three current sources coupled in series, and the active inductor introduces a transconductance such that the NF is reduced and the gain is increased. Since the active inductor replaces the on-chip spiral inductor, the size of the low noise amplifier is reduced. The active inductor can further provide input impedance matching for the low noise amplifier.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
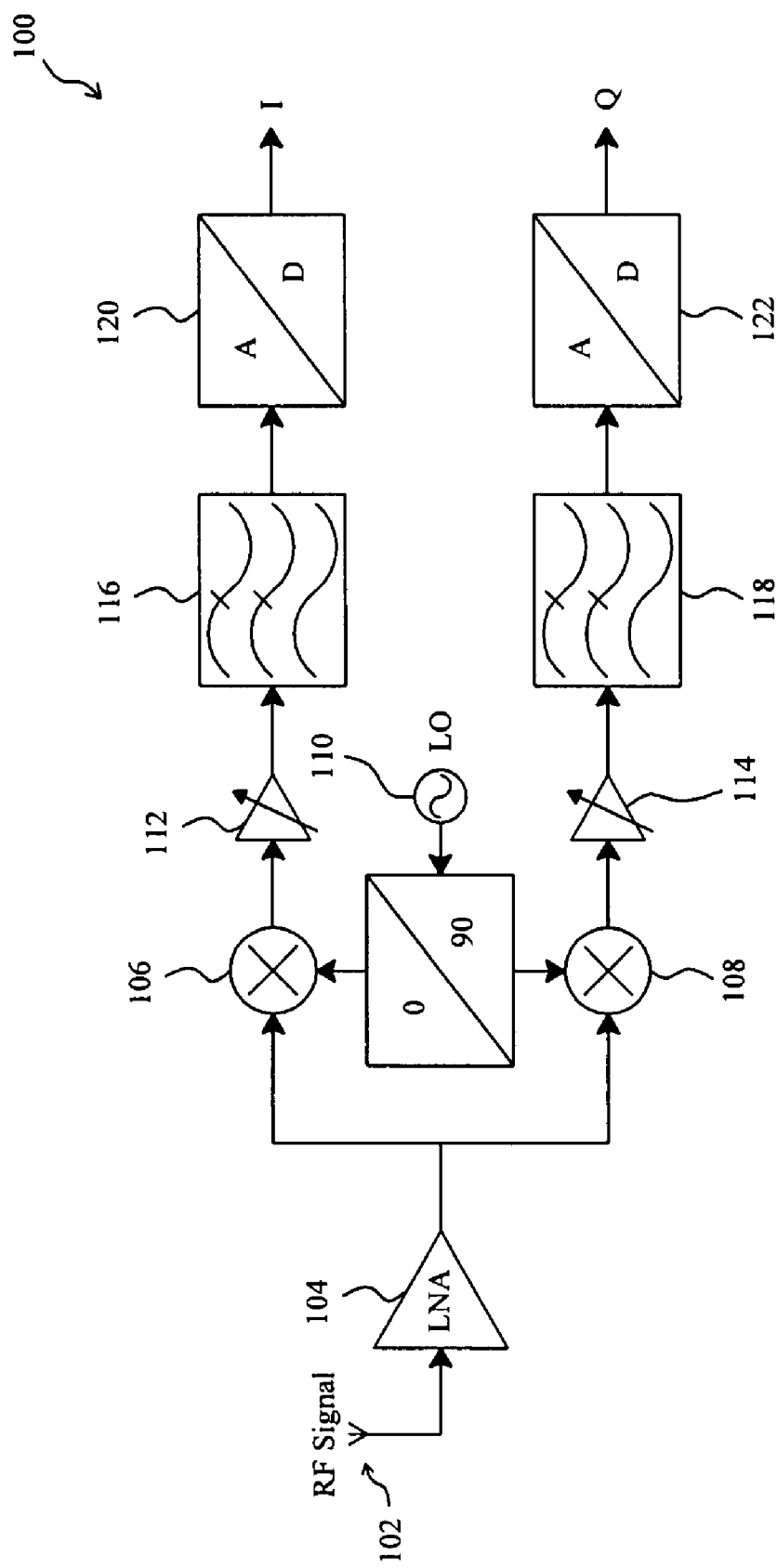
FIG. 1 is a block diagram of a conventional RF receiver system.
Figures 2, 3:
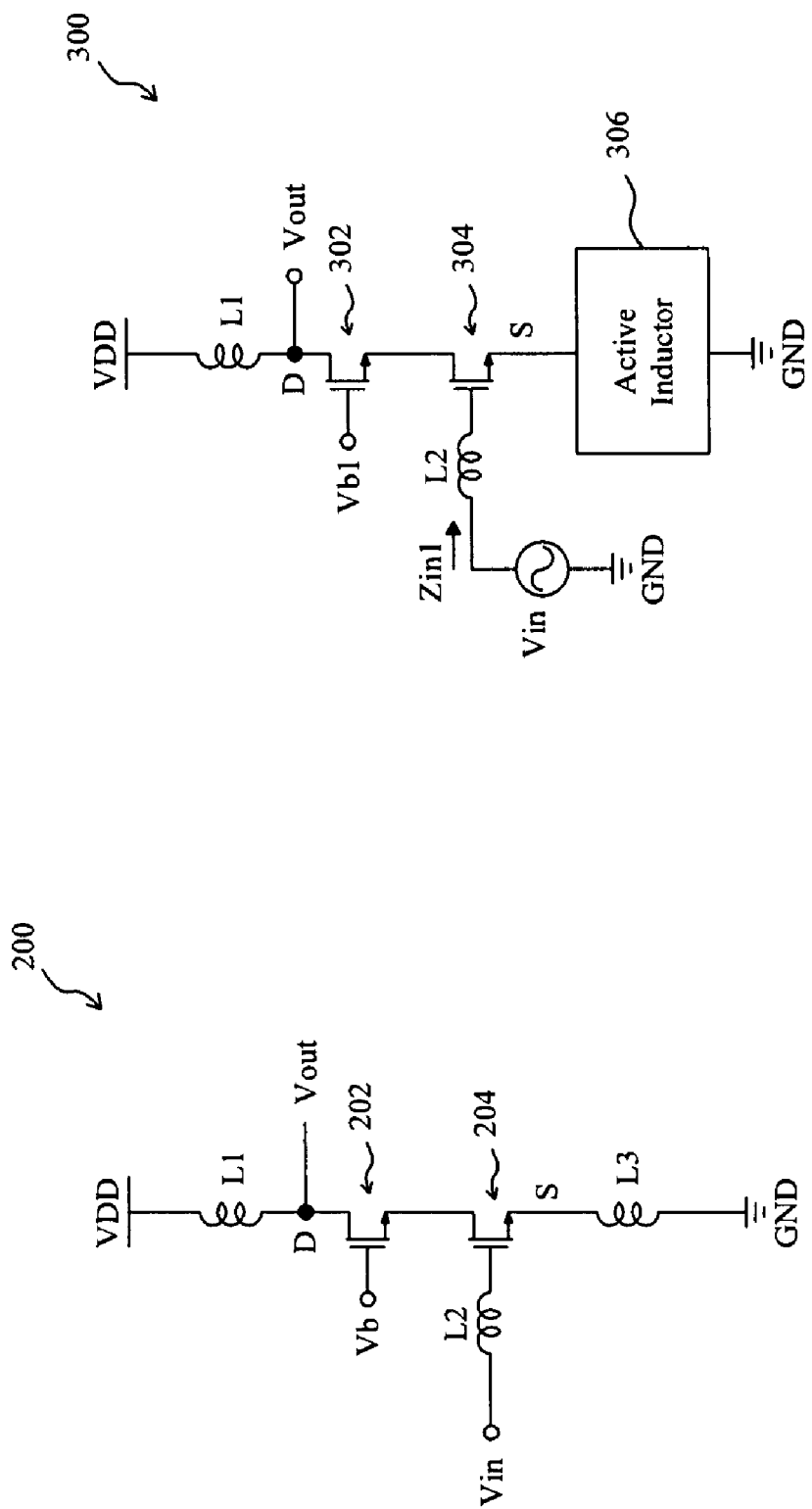
FIG. 2 is a conventional cascode low noise amplifier.
FIG. 3 is a cascode low noise amplifier according to the present invention.

FIG. 3 provides a cascode low noise amplifier 300 according to the present invention, which comprises a pair of cascode transistors 302 and 304, and a load inductor L1 coupled to the drain D of the output transistor 302. The drain D of the output transistor 302 is also the output of the low noise amplifier 300 to provide the output signal Vout, and the gate of the output transistor 302 is coupled with a bias voltage Vb1. The input transistor 304 has a gate coupled with an input signal Vin through an input inductor L2, and a source S coupled with an active inductor 306. The input impedance seen from the input Vin is Zin1. Preferably, all the elements 302, 304 and 306 are integrated into a same chip. Either one of the inductors L1 and L2 may be an external wire-wound inductor, an on-chip spiral inductor, or an active inductor. If the load inductor L1 is an on-chip spiral inductor or an active inductor, it can be also integrated with the elements 302, 304 and 306 into the same chip, and it is the same for the input inductor L2. In this embodiment, the signal path is from the input Vin to the output Vout through the input inductor L2, the input transistor 304, and the output transistor 302. The active inductor 306 is not on this signal path, so it introduces less noise. If the load inductor L1 is an active inductor, it may introduce more noise because it is coupled to the output Vout. In other embodiments, resistor, transistor or other electronic element may replace the load inductor L1 to serve as the load element.

Figure 5:
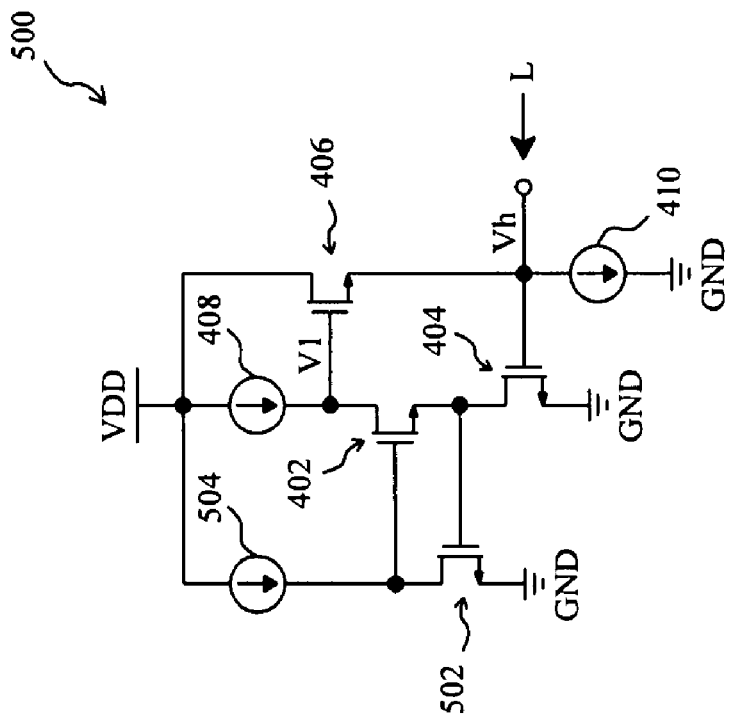
FIG. 5 is a typical regulated cascode active inductor.
Figure 4:
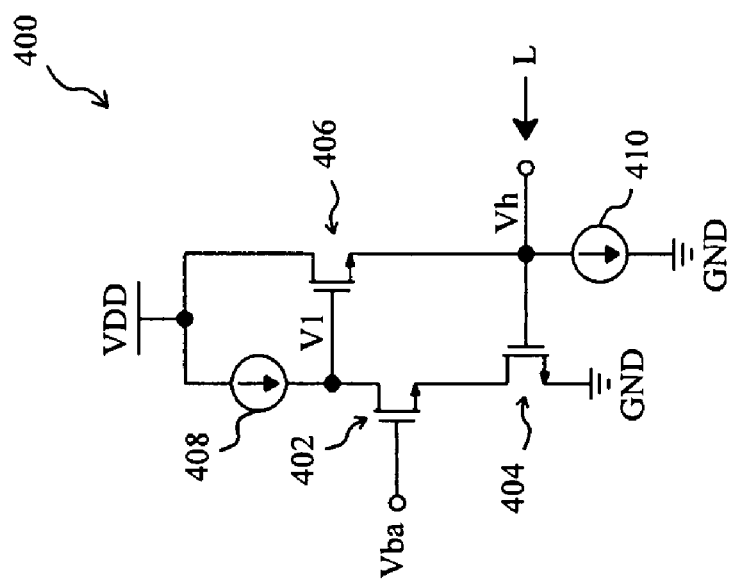
FIG. 4 is a typical cascode active inductor.

FIGS. 4 and 5 show a typical cascode active inductor 400 and a typical regulated cascode active inductor 500, respectively. Either one of them can be regarded as an inductor L when seen from the node Vh. The cascode active inductor 400 of FIG. 4 comprises a pair of cascode transistors 402 and 404, the drain of the transistor 402 is coupled to the gate of a transistor 406 and a current source 408, the gate of the transistor 402 is coupled with a bias voltage Vba, and the gate of the transistor 404, the source of the transistor 406, and a current source 410 are all coupled to the node Vh. The regulated cascode active inductor 500 of FIG. 5 includes the circuit of FIG. 4, and the bias voltage to the gate of the transistor 402 is provided by the serially coupled transistor 502 and current source 504. As described in Thanachayanont and Payne, "VHF CMOS integrated active inductor", Electronics Letters, vol. 32, pp. 999-1000, May 1996, the active inductors 400 and 500 may reduce the output conductance at the node V1, thereby reducing the inductor loss in the circuits.

Figure 6:
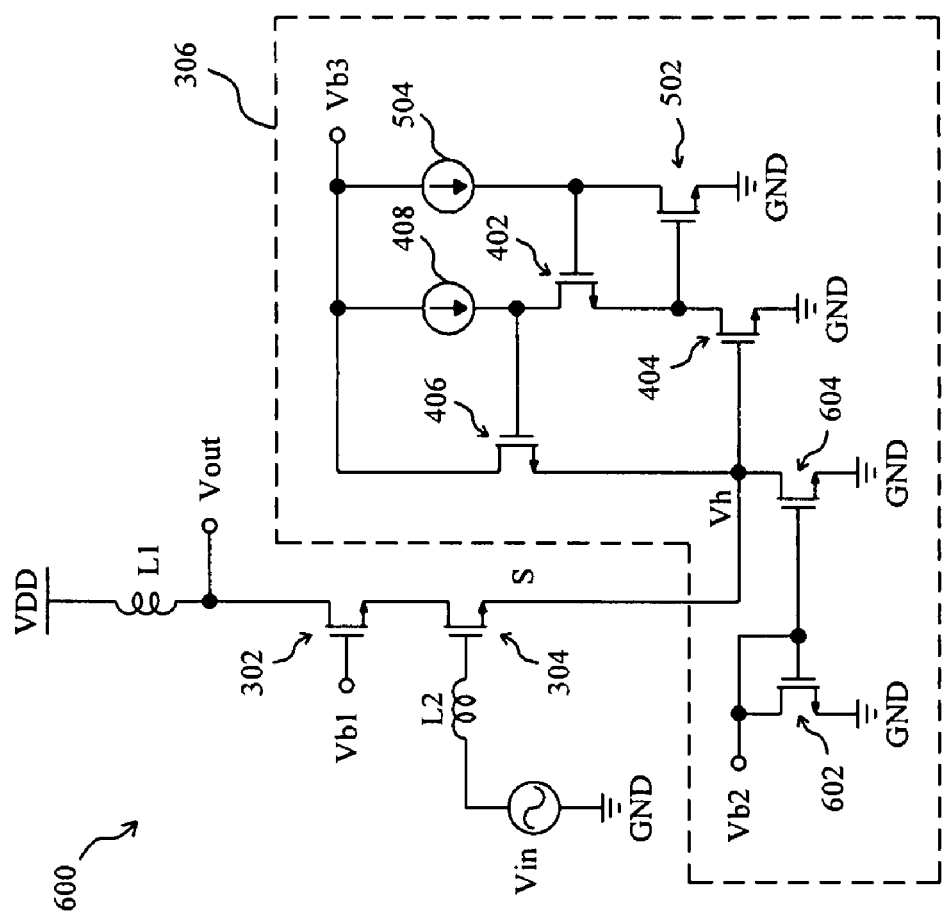
FIG. 6 is a combination of the circuits of FIGS. 3 and 5.

FIG. 6 shows a cascode low noise amplifier 600, which is the circuit of FIG. 3 having the regulated cascode active inductor 500 of FIG. 5 as the active inductor 306, and the current mirror composed of two transistors 602 and 604 as the current source 410 of FIG. 5. In this current mirror, the drain and gate of the bias transistor 602 are both coupled with a bias voltage Vb2, and the drain of the mirror transistor 604 is the output of the active inductor 306 coupled to the source S of the transistor 304. In the active inductor 306, the transistor 406 and the power inputs of the current sources 408 and 504 are all coupled with a bias voltage Vb3. Either one of the current sources 408 and 504 may employ current mirror configuration. The use of current mirror for implementing current source is well known. Because the active inductor 306 is coupled to the source of the transistor 304, but not on the signal path, less noise will be introduced. In this embodiment, only one transistor 604 is used to serially couple to the cascode transistors 302 and 304, so the supply voltage VDD can be small but enough to support the biases of the transistors 302, 304, and 604 at normal working point, and it is therefore suitable for low voltage applications, such as cell phone, personal digital assistant (PDA), notebook computer and other handheld or portable devices with battery power supply. In other embodiments for higher voltage applications, an active inductor configured by other different circuits can be coupled between the source S of the transistor 304 and ground GND. The active inductor 306 is constructed with active elements, so can be produced by standard semiconductor process, for example CMOS process. In a preferred embodiment, the transistors 302 and 304 and the active inductor 306 are all constructed with MOS elements, so they can be integrated into a same chip by standard CMOS process. Another advantage of producing the transistors 302 and 304 and the active inductor 306 by standard CMOS process is that they can be integrated into the same chip having the other parts of the device, thereby decreasing the number of chips in the device and lowering the cost. Another advantage of the active inductor 306 is that it is adjustable, so the low noise amplifier 600 is also adjustable. In a preferred embodiment, the inductance of the active inductor 306 is about 0.5-5 nH, and the operating frequency of the low noise amplifier 600 is 5.7 GHz. If higher frequency is desired for the active inductor 306 to operate, more advanced process may be used.

Figure 7:
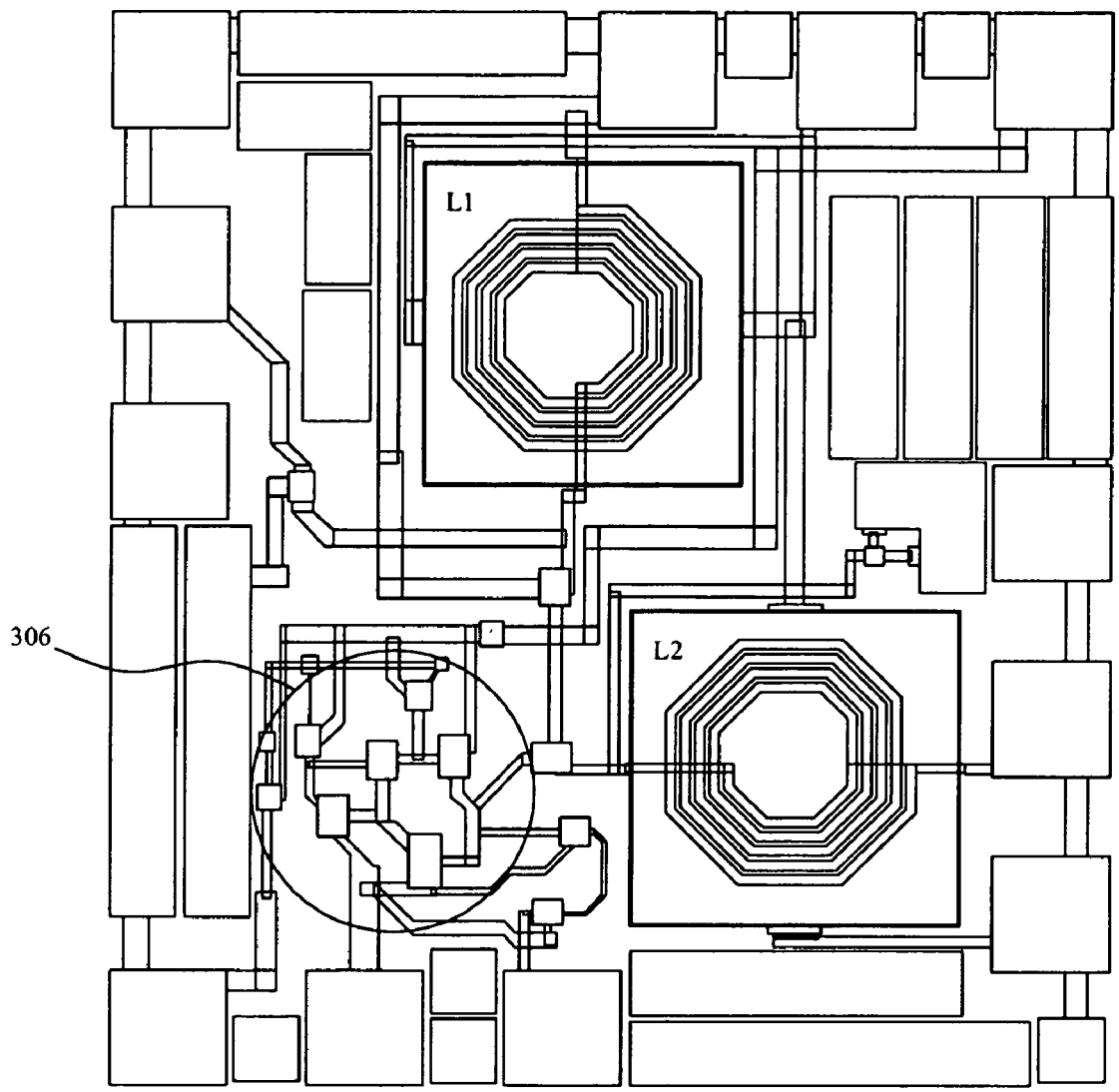
FIG. 7 is a top view of a physical chip including the cascode low noise amplifier shown in FIG. 3.

In an embodiment as shown in FIG. 7, both of the inductors L1 and L2 are on-chip spiral inductors and are integrated into the same chip having the transistors 302 and 304 and the active inductor 306. FIG. 7 also shows that the active inductor 306 constructed by active elements occupies less chip area than the on-chip spiral inductors L1 and L2, thereby reducing the whole size of the low noise amplifier 600. Another advantage of using the active inductor 306 is that the manufacture of the elements of the active inductor 306 is simpler and easier, and requires lower cost therefore.

Figure 9:
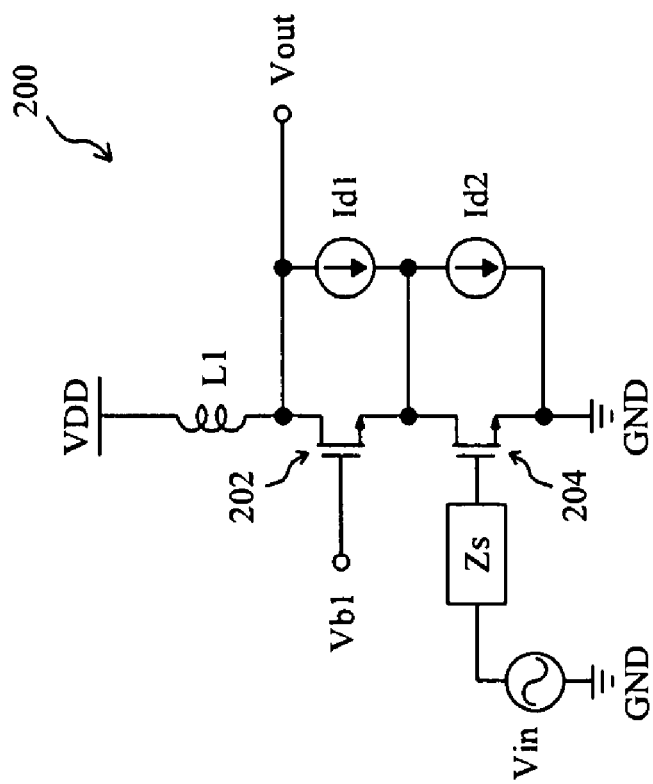
FIG. 9 is an equivalent circuit of the low noise amplifier shown in FIG. 2 when taking the noise into consideration.
Figure 8:
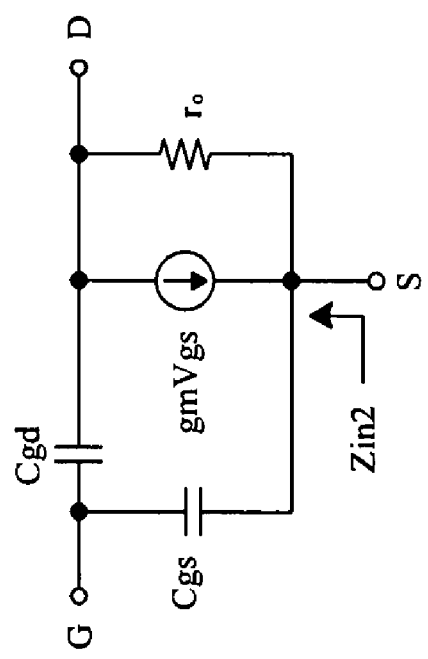
FIG. 8 is a small-signal model of a MOS transistor.
Figures 10, 11:
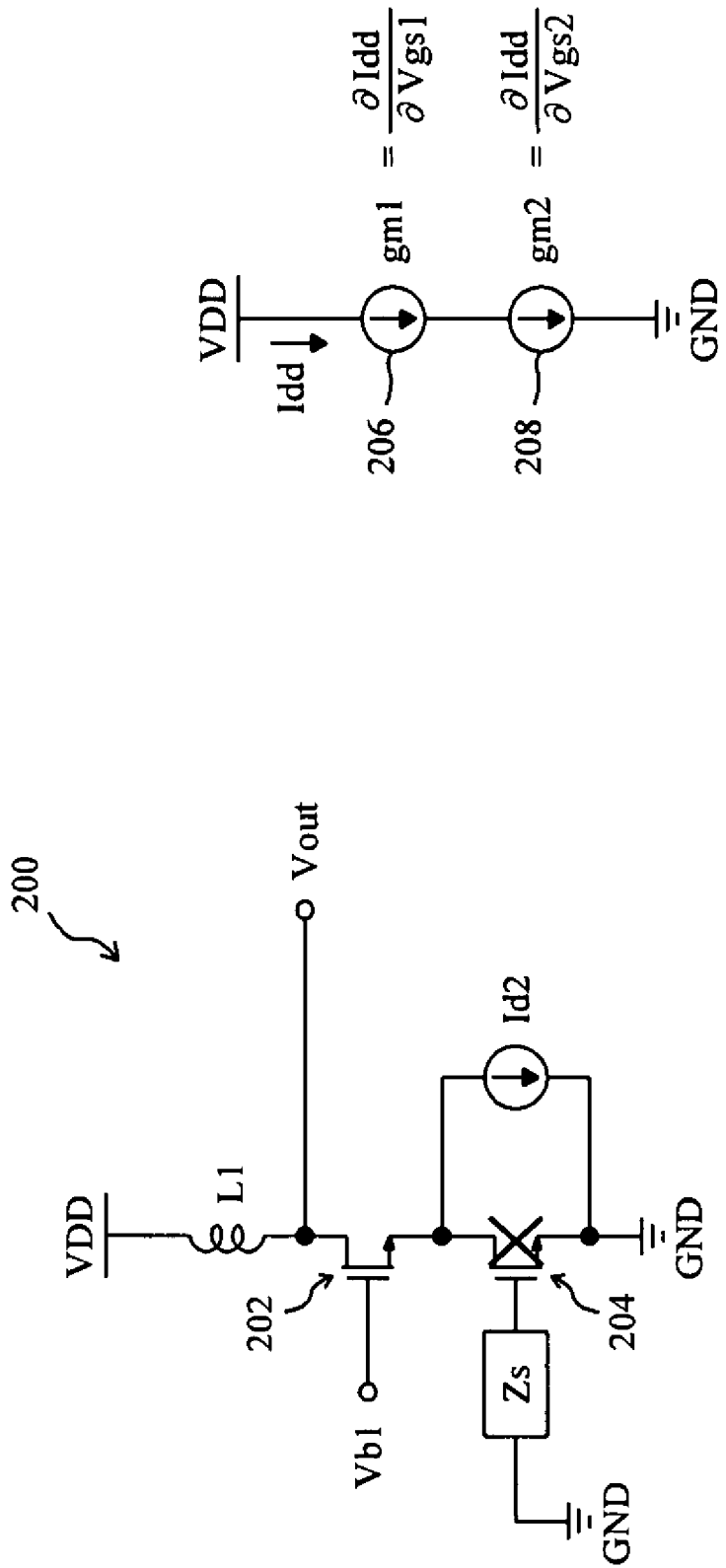
FIG. 10 is an equivalent circuit of the low noise amplifier shown in FIG. 2 when calculating the transimpedance thereof.
FIG. 11 is an equivalent circuit of the low noise amplifier shown in FIG. 2 when regarding the pair of cascode transistors as two current sources.

The principle of the low noise amplifier circuit 300 shown in FIG. 3 is described as below. FIG. 8 is a small-signal model of a MOS transistor, in which capacitor Cgs represents the gate-to-source parasitic capacitance, capacitor Cgd represents the gate-to-drain parasitic capacitance, gm represents the transconductance of the MOS transistor, Vgs represents the gate-to-source voltage, resistor ro represents the channel resistance, and Zin2 represents the input impedance seen from the source S. At first, the NF of a cascode low noise amplifier is explained. As shown in FIG. 9, two currents Id1 represent the noise currents of the transistors 202 and 204 in the low noise amplifier 200 of FIG. 2, and Zs represents the input impedance. Because there is no Miller effect on the transistor 202, the small-signal voltage gain of the low noise amplifier 200 is $$Av = Vout/Vin \quad [\text{Eq-1}]$$
$$= \frac{\frac{1}{s(Cgs2+Cm2)}}{Zs+\frac{1}{s(Cgs2+Cm2)}} \cdot [(-gm2) \cdot Zin2] \cdot [gm1 \cdot (sL1)],$$

where gm1 is the transconductance of the transistor 202, gm2 is the transconductance of the transistor 204, Cm2 is the Miller effect on the gate of the transistor 204, and Cgs2 is the gate-to-source parasitic capacitance of the transistor 204. With reference to FIG. 10, the transimpedance of the noise current Id2 is defined as $$Rm2 = Vout/Id2 = (gm1 \cdot sL1)/(gm1 + sCgs1), \quad [\text{Eq-2}]$$

where Cgs1 is the gate-to-source parasitic capacitance of the transistor 202. Therefore, the noise current Id2 can be converted into a Thevenin equivalent voltage $\overline{Vn2}$ in a stack manner. The transimpedance of the noise current Id1 can be defined as $$Rm1 = Vout/Id1 = (-sCgs1 \cdot sL1)/(sCgs1 + gm1). \quad [\text{Eq-3}]$$

Figure 13:
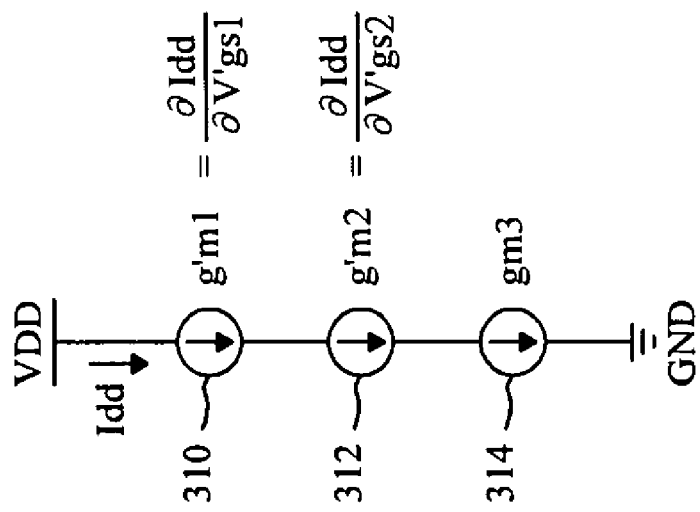
FIG. 13 is an equivalent circuit of the low noise amplifier shown in FIG. 3 when regarding the pair of cascode transistors and the active inductor as three current sources coupled in series.
Figure 12:
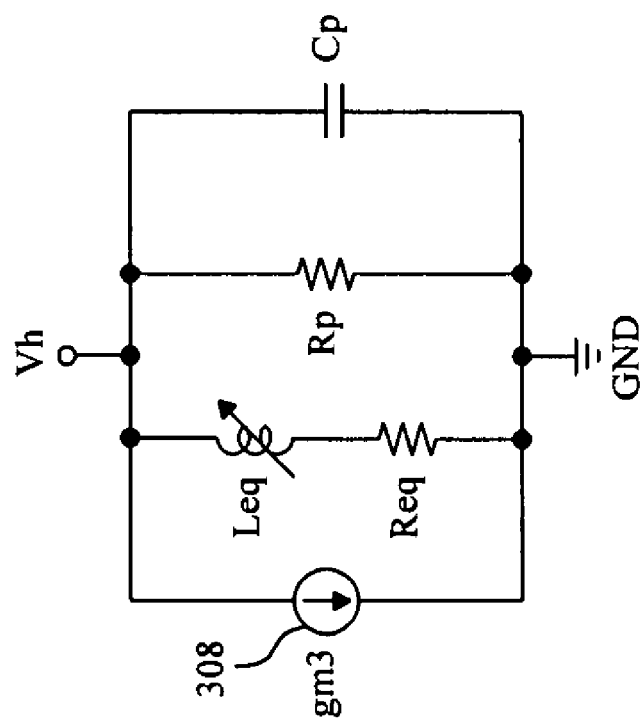
FIG. 12 is a small-signal equivalent circuit of an active inductor.

With reference to Gonzalez, "Microwave transistor amplifiers: analysis and design", Prentice Hall, Lee, "The Design of CMOS Radio-Frequency Integrated Circuits", Cambridge University Press, 1998, and Sodini et al., "The effect of high fields on MOS device and circuit performance", IEEE Transactions on Electron. Devices, Vol. ED-31, No. 10, OCT, 1984, from the equations Eq-1, Eq-2 and Eq-3, the equivalent NF at the output Vout of the cascode low noise amplifier 200 is approximately $$NF = \quad [\text{Eq-4}]$$
$$1 + \left[ \overline{V^2 ng2} + \left( \frac{\overline{I^2 d2}}{g^2 m2} + \frac{\overline{I^2 d1} \times \omega^2 C^2 gs2}{g^2 m2 \times g^2 m1} \right) \cdot \omega^2 (Cgs2+Cm2)^2 \cdot \right.$$
$$\left. \left| Zs + \frac{1}{j\overline{\omega}(Cgs2+Cm2)} \right|^2 \right] / \overline{V^2 ns2},$$

where ω is the angular frequency, and Vng2 and Vns 2 are two Thevenin equivalent voltages at the gate and the source of the transistor 204, respectively. The equation Eq-4 shows that the NF is decreased with the increasing of gm1 and gm2, or the decreasing of the impedance Zs. According to Sodini et al., "The effect of high fields on MOS device and circuit performance", IEEE Transactions on Electron. Devices, Vol. ED-31, No. 10, OCT, 1984, the saturation current of a short channel MOS transistor is $$Idd \approx W \cdot Cox \cdot (Vgs - Vth) \cdot Vsat, \quad [\text{Eq-5}]$$

where W is the channel width of the transistor, Cox is the capacitance of the gate oxide, Vth is the threshold voltage of the transistor, and Vsat is the gate-source saturation voltage. The transimpedance of the short channel MOS transistor is $$gm \equiv \partial Idd / \partial Vgs = K \cdot W \cdot Cox \cdot Vsat, \quad [\text{Eq-6}]$$

where K is a constant between 0 and 1. The equation Eq-6 shows that increasing the channel width W2 of the transistor 204 can increase the transconductance gm2 of the conventional low noise amplifier 200. Although the increase of the channel width W2 also increases the capacitance Cgs2, according to the equation Eq-4, the contribution of the increased Cgs2 to the noise is compensated by the increased gm2 in the denominator. However, the increased channel width W2 of the transistor 204 will result in greater current Idd, and thereby consume more power. As shown in FIG. 11, according to the small-signal model of MOS transistor shown in FIG. 8, the conventional low noise amplifier 200 of FIG. 2 can be regarded as two current sources 206 and 208 coupled in series. If the current flowing therethrough is Idd, the transconductance of the transistor 202 is $$gm1 = \partial Idd / \partial Vgs1, \quad [\text{Eq-7}]$$

where Vgs1 is the gate-to-source voltage of the transistor 202, and the transconductance of the transistor 204 is $$gm2 = \partial Idd / \partial Vgs2, \quad [\text{Eq-8}]$$

where Vgs2 is the gate-to-source voltage of the transistor 204. FIG. 12 shows a small-signal equivalent circuit of an active inductor, which comprises a current source 308, an equivalent variable inductor Leq, an equivalent series resistor Req, a parasitic parallel resistor Rp, and a parasitic parallel capacitor Cp. According to the small-signal models of FIGS. 8 and 12, the low noise amplifier 300 of FIG. 3 can be regard as three current sources 310, 312, and 314 coupled in series, as shown in FIG. 13. If the current flowing therethrough is Idd, the transconductance of the transistor 302 is $$g'm1 = \partial Idd/\partial V'gs1, \quad [Eq-9]$$

where V"gs1 is the gate-to-source voltage of the transistor 302, and the transconductance of the transistor 304 is $$g'm2 = \partial Idd/\partial V'gs2, \quad [Eq-10]$$

where V'gs2 is the gate-to-source voltage of the transistor 304. Because the circuit of FIG. 13 has one transconductance gm3 more than the circuit of FIG. 11, for the same current Idd, the gate-to-source voltages V'gs1 and V'gs2 of the transistors 302 and 304 must be smaller than the gate-to-source voltages Vgs1 and Vgs2 of the transistors 202 and 204, respectively, and therefore the transconductances g'm1 and g'm2 of the transistor 302 and 304 are greater than the transconductances gm1 and gm2 of the transistor 202 and 204, respectively. From the equation Eq-4, when the transconductances of the pair of cascode transistors of the cascode low noise amplifier increase, the NF decreases, so the low noise amplifier 300 has smaller NF. Moreover, because the transconductances g'm1 and g'm2 of the transistors 302 and 304 are greater, the low noise amplifier 300 has greater gain.

Figure 14:
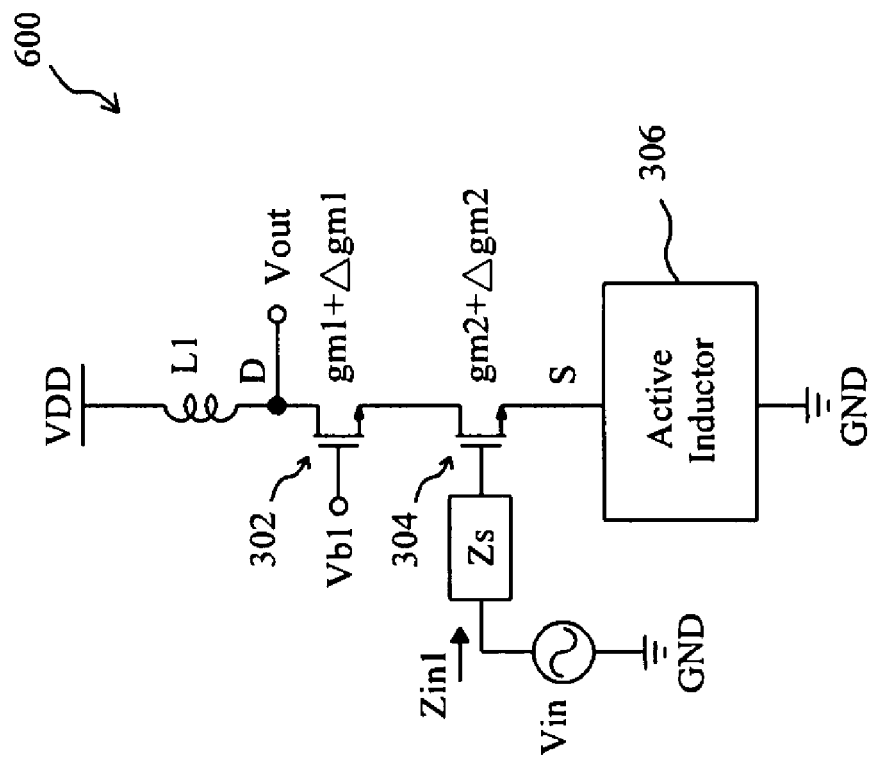
FIG. 14 shows the case that the active inductor provides input impedance matching for the low noise amplifier of FIG. 3.

As shown in FIG. 14, in addition to adaptive inductor function, the active inductor 306 also provides input impedance matching function. For achieving good matching, the active inductor 306 can be so designed to be adjustable. With reference to FIG. 9, when the channel width W1 of the transistor 204 increases, the gate-to-source parasitic capacitance Cgs2 also increases, so it must increase inductively to compensate the increased Cgs2. The conventional design will increase the input impedance Zs when it is desired to increase the channel width W2 of the transistor 204. The equation Eq-4 shows that the impedance Zs will contribute to the noise to the low noise amplifier 200, and therefore the greater impedance Zs will result in greater noise. With reference to FIG. 14, to provide the same input inductively, it can be achieved by decreasing the impedance Zs and increasing the inductively of the active inductor 306. Therefore, it saves more chip area.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A cascode low noise amplifier comprising:
   an active inductor, the active inductor including a regulated cascode active inductor, the regulated cascode active inductor including a current mirror; and
   a pair of cascode transistors, the first transistor having a source coupled to an output of the current mirror and a gate for receiving an input signal, and the second transistor having a drain for providing an output signal, said active inductor for selectively adjusting the frequency of the low noise amplifier.

2. The low noise amplifier of claim 1, wherein the active inductor and the pair of cascode transistors are integrated on a chip.

3. The low noise amplifier of claim 2, wherein the active inductor and the pair of cascode transistors are produced by a CMOS process.

4. The low noise amplifier of claim 1, wherein the active inductor provides an impedance matching function for the low noise amplifier.

5. A low noise amplifier comprising:
   an active inductor, the active inductor including a cascode active inductor; and
   a pair of cascode transistors, the first transistor having a source coupled to the active inductor and a gate for receiving an input signal, and the second transistor having a drain for providing an output signal, said active inductor for selectively adjusting the frequency of the low noise amplifier, wherein the cascode active inductor includes a current mirror having an output coupled to the source of the first transistor.

6. The low noise amplifier of claim 5, wherein the active inductor and the pair of cascode transistors are integrated on a chip.

7. The low noise amplifier of claim 6, wherein the active inductor and the pair of cascode transistors are produced by a CMOS process.

8. The low noise amplifier of claim 5, wherein the active inductor provides an input impedance matching function for the low noise amplifier.

9. A cascode low noise amplifier comprising:
   a pair of cascode transistors for behaving as two current sources coupled in series, the first transistor having a first transconductance, and the second transistor having a second transconductance; and
   an active inductor serially coupled to the pair of cascode transistors, for behaving as a third current source having a third transconductance, the active inductor including a regulated cascode active inductor, the regulated cascode active inductor including a current mirror having an output coupled to a source of the first transistor to thereby couple the active inductor to the source of the second transistor.

10. The low noise amplifier of claim 9, wherein the third transconductance has a value to increase a gain of the low noise amplifier.

11. The low noise amplifier of claim 9, wherein the third transconductance has a value to decrease a noise figure of the low noise amplifier.

12. A cascode low noise amplifier comprising:
   a pair of cascode transistors for behaving as two current sources coupled in series, the first transistor having a first transconductance, and the second transistor having a second transconductance; and
   an active inductor serially coupled to the pair of cascode transistors for behaving as a third current source having a third transconductance, the active inductor including a cascode active inductor, the cascode active inductor including a current mirror having an output coupled to a source of the first transistor to thereby couple the active inductor to the source of the second transistor.

13. The low noise amplifier of claim 12, wherein the third transconductance has a value to increase a gain of the low noise amplifier.

14. The low noise amplifier of claim 12, wherein the third transconductance has a value to decrease a noise figure of the low noise amplifier.

* * * * *